US008183853B2

(12) United States Patent
Cornelius et al.

(10) Patent No.: US 8,183,853 B2
(45) Date of Patent: May 22, 2012

(54) POWER NETWORK SENSOR DEVICES AND RELATED METHODS

(75) Inventors: Jonathan Conrad Cornelius, Lillington, NC (US); Sherif Kamel, Cary, NC (US)

(73) Assignee: Tyco Electronics Corporation, Berwyn, PA (US)

( * ) Notice: Subject to any disclaimer, the term of this patent is extended or adjusted under 35 U.S.C. 154(b) by 438 days.

(21) Appl. No.: 12/483,530

(22) Filed: Jun. 12, 2009

(65) Prior Publication Data

US 2010/0315067 A1    Dec. 16, 2010

(51) Int. Cl.
G01R 15/20    (2006.01)
(52) U.S. Cl. .................................... 324/117 H
(58) Field of Classification Search .................. None
See application file for complete search history.

(56) References Cited

U.S. PATENT DOCUMENTS

| | | | |
|---|---|---|---|
| 4,056,816 A | | 11/1977 | Guim |
| 4,363,064 A | * | 12/1982 | Billings et al. ................. 361/57 |
| 4,673,928 A | | 6/1987 | Guim |
| 4,698,621 A | | 10/1987 | Masot |
| 5,170,311 A | * | 12/1992 | Zulaski et al. ................. 361/94 |
| 7,218,496 B2 | * | 5/2007 | Kitagawa ..................... 361/93.9 |
| 7,233,474 B2 | * | 6/2007 | Brown et al. .................. 361/104 |
| 7,791,846 B2 | * | 9/2010 | Roscoe et al. ..................... 361/2 |
| 8,094,424 B2 | * | 1/2012 | Cornelius et al. ............ 361/93.1 |
| 2006/0012932 A1 | * | 1/2006 | Kitagawa ..................... 361/93.1 |
| 2008/0165461 A1 | * | 7/2008 | Paik et al. ........................ 361/87 |
| 2009/0213505 A1 | | 8/2009 | Cornelius et al. |
| 2010/0214709 A1 | * | 8/2010 | Hall et al. ..................... 361/93.9 |
| 2011/0216448 A1 | * | 9/2011 | Hisada et al. .................... 361/18 |

FOREIGN PATENT DOCUMENTS

| | | |
|---|---|---|
| DE | 195 14 580 A1 | 10/1996 |
| DE | 20 2004 002 714 U1 | 6/2004 |
| WO | WO 00/28635 | 5/2000 |

OTHER PUBLICATIONS

International Search Report and the Written Opinion for PCT/US2009/000716, mailed on Apr. 8, 2009.

* cited by examiner

*Primary Examiner* — Jermele M Hollington
(74) *Attorney, Agent, or Firm* — Myers Bigel Sibley & Sajovec (57) ABSTRACT

An operation detection device for an overcurrent protection component that detects a transition event between a closed state and an open state of the protection component includes an event sensor positioned at a location selected to allow the event sensor to detect the transition event and a current sensor positioned at a location selected to detect a current passing through the overcurrent protection component and to generate a first output signal based on a level of the detected current. A switch circuit operatively coupled to the event sensor is configured to generate a second output signal indicating a change in state of the overcurrent protection component responsive to detection of the transition event by the event sensor.

20 Claims, 6 Drawing Sheets

POWER NETWORK SENSOR DEVICES AND RELATED METHODS

FIELD OF THE INVENTION

The present invention relates to power distribution network devices, and in particular, to sensor devices for such networks.

BACKGROUND

In power distribution networks, there are typically many cable overcurrent protection devices, such as limiters and fuses, that limit and/or even prevent cable damage due to over-current situations that may be caused by circuit overloads, inadvertent short circuit faults and/or the like. The responsible party (such as the utility company) may benefit if they know when these limiting devices operate, e.g., to open the respective electric circuit or link.

Conventional "blown fuse indicators" typically use a small, fusible wire that is electrically connected to a larger, primary fuse element. A spring-loaded flag or other indicia is held in a closed position by the fusible wire. When the fuse element opens a circuit in response to an over-current and/or over-voltage condition, the fusible wire is liquefied, and, consequently, the spring-loaded flag is deployed. However, fusible wires that are electrically integrated with the fuse element and release a spring-loaded indicator may not be easily installed on existing equipment (i.e., retrofitted) and/or may present difficulties with resettability.

It has also been proposed to provide an operation detection device for an overcurrent protection component that need not be electrically integrated with a fuse element. Such devices are described, for example, in co-pending U.S. patent application Ser. No. 12/137,154, filed Jun. 11, 2008, which application is incorporated herein by reference as if set forth in its entirety.

As the power market moves toward the need for more intelligence from the power grid, additional information may be used to monitor the status of the power network system.

SUMMARY OF EMBODIMENTS OF THE INVENTION

According to some embodiments of the invention, an operation detection device for an overcurrent protection component is provided. The overcurrent protection component has a closed state and an open state and outputs a transition event responsive to a transition between the closed state and the open state. The detection device includes an event sensor positioned at a location selected to allow the event sensor to detect the transition event and a current sensor positioned at a location selected to detect a current passing through the overcurrent protection component and to generate a first output signal based on a level of the detected current. A switch circuit is operatively coupled to the event sensor that is configured to generate a second output signal indicating a change in state of the overcurrent protection component responsive to detection of the transition event by the event sensor.

In further embodiments, the detection device further includes a housing configured to attach to the overcurrent protection component. The event sensor, the current sensor and the switch circuit are positioned in the housing and the housing is configured to be attached so as to position the event sensor and the current sensor at their respective selected locations.

In other embodiments, an adjustable calibration component is operatively coupled to the current sensor that is configured to set the sensitivity of the current sensor to the level of the detected current. The current sensor may be a Hall-effect sensor and the adjustable calibration component may be a movable magnetic field enhancing component. The magnetic field enhancing component may be a ferrite core element mounted proximate the Hall-effect sensor that is movable relative to the Hall-effect sensor to set a desired sensitivity of the Hall-effect sensor to the level of the detected current. The ferrite core element may be a pair of ferrite core elements positioned on opposite sides of the Hall-effect sensor.

In other embodiments, the magnetic field enhancing component is a metal screw, accessible from outside the housing, that may be rotated to set a desired air gap between an end of the metal screw and the Hall-effect sensor to set a desired sensitivity of the Hall-effect sensor to the level of the detected current. The metal screw may be a pair of metal screws with the Hall-effect sensor positioned therebetween and the metal screws may be respectively rotated to change a distance between ends thereof proximate the Hall-effect sensor.

In further embodiments, the detection device includes a housing configured to attach to the overcurrent protection component and the event sensor, the Hall-effect sensor and the switch circuit are positioned in the housing. The housing is configured to be attached so as to position the event sensor and the current sensor at their respective selected locations. Second ends of the metal screws are configured to be rotationally driven and are accessible from outside the housing.

In yet other embodiments, a magnetic flux concentrator extends around the overcurrent protection component that has a first end coupled to one of the metal screws and a second, opposite, end coupled to the other of the metal screws. The magnetic flux concentrator may be a bracket configured to attach the housing to the overcurrent protection device.

In further embodiments, the first output signal and the second output signal have a first state indicating the transition event has been detected, a second state indicating the level of the detected current and a third state indicating a failure of the operation detection device. The Hall-effect sensor may output an intermediate voltage level between a supply voltage level and ground when no current is detected and the event sensor may output a square wave when the transition event is detected. The first state may be the square wave as the second output signal, the second state may be a voltage signal having a peak voltage corresponding to the level of the detected current as the first output signal and the third state may be a ground signal as the first output signal.

In other embodiments, the first output signal is routed through the switch circuit and combined with the second output signal to provide a single composite signal having the first state, the second state and the third state. The switch circuit may further include a transmitter configured to transmit the composite signal to provide a remote notification. The operation detection device may further include a light emitting device (LED) and the switch circuit may be configured to illuminate the LED responsive to detection of the transition event by the event sensor to provide a local notification of detection of the transition event.

In other embodiments, an overcurrent protection assembly is provided including an overcurrent protection component and an operation detection device as described above.

In yet further embodiments, a current sensing device for an overcurrent protection component is provided. The overcurrent protection component has a closed state and an open state and outputs a transition event responsive to a transition between the closed state and the open state. The current sensing device includes a housing configured to attach to the overcurrent protection component. A Hall-effect sensor is positioned in the housing to detect a current passing through the overcurrent protection component and to generate an output signal based on a level of the detected current. The housing is configured to be attached so as to position the Hall-effect sensor at a selected location to detect the current. An adjustable magnetic field enhancing component is also provided. The adjustable magnetic field enhancing component is a pair of metal screws with the Hall-effect sensor positioned therebetween. The metal screws may be respectively rotated to change a distance between first ends thereof proximate the Hall-effect sensor. Second ends of the metal screws configured to be rotationally driven are accessible from outside the housing.

In other embodiments, the current sensing device further includes a magnetic flux concentrator extending around the overcurrent protection component that has a first end coupled to one of the metal screws and a second, opposite, end coupled to the other of the metal screws. The magnetic flux concentrator may be a bracket configured to attach the housing to the overcurrent protection device.

In yet further embodiments, a method for calibrating a current sensing device for an overcurrent protection component is provided. The overcurrent protection component has a closed state and an open state and outputs a transition event responsive to a transition between the closed state and the open state. The method includes positioning a housing containing the current sensing device at a selected location on the overcurrent protection component. A bracket that is a magnetic flux concentrating material is placed around the overcurrent protection component with respective ends of the bracket positioned proximate opposite sides of the housing. The housing is coupled to the overcurrent protection device using respective first and second screws extending into the housing to a position proximate a Hall-effect current sensor in the housing. A gap between ends of the screws proximate the Hall-effect current sensor is adjusted by rotating opposite ends of the screws extending from the housing to obtain a desired sensitivity of the Hall-effect sensor to a current flowing through the overcurrent protection component.

DETAILED DESCRIPTION OF EMBODIMENTS OF THE INVENTION

The present invention now will be described hereinafter with reference to the accompanying drawings and examples, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Like numbers refer to like elements throughout. In the figures, the thickness of certain lines, layers, components, elements or features may be exaggerated for clarity.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

It will be understood that when an element is referred to as being "on," "attached" to, "connected" to, "coupled" with, "contacting," etc., another element, it can be directly on, attached to, connected to, coupled with or contacting the other element or intervening elements may also be present. In contrast, when an element is referred to as being, for example, "directly on," "directly attached" to, "directly connected" to, "directly coupled" with or "directly contacting" another element, there are no intervening elements present. It will also be appreciated by those of skill in the art that references to a structure or feature that is disposed "adjacent" another feature may have portions that overlap or underlie the adjacent feature.

Spatially relative terms, such as "under," "below," "lower," "over," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. Thus, the exemplary term "under" can encompass both an orientation of "over" and "under." The device may be otherwise oriented (rotated 90 degrees or at other orientations) and the spatially relative descriptors used herein interpreted accordingly. Similarly, the terms "upwardly," "downwardly," "vertical," "horizontal" and the like are used herein for the purpose of explanation only unless specifically indicated otherwise.

It will be understood that, although the terms "first," "second," etc. may be used herein to describe various elements, these elements should not be limited by these terms. These terms are only used to distinguish one element from another. Thus, a "first" element discussed below could also be termed a "second" element without departing from the teachings of the present invention. The sequence of operations (e.g., illustrated in flowcharts) is not limited to the order presented in the claims or figures unless specifically indicated otherwise.

The present invention is described below with reference to block diagrams and/or flowchart illustrations of methods, apparatus (systems) and/or computer program products according to some embodiments of the invention. It is understood that each block of the block diagrams and/or flowchart illustrations, and combinations of blocks in the block diagrams and/or flowchart illustrations, can be implemented by computer program instructions. These computer program instructions may be provided to a processor of a general purpose computer, special purpose computer, and/or other programmable data processing apparatus to produce a machine, such that the instructions, which execute via the processor of the computer and/or other programmable data processing apparatus, create means for implementing the functions/acts specified in the block diagrams and/or flowchart block or blocks.

As will be appreciated by one of skill in the art, the invention may be embodied as a method, device, or computer program product. Accordingly, the present invention may take the form of an entirely hardware embodiment or an embodiment combining software and hardware aspects all generally referred to herein as a "circuit" or "module."

Figure 1:
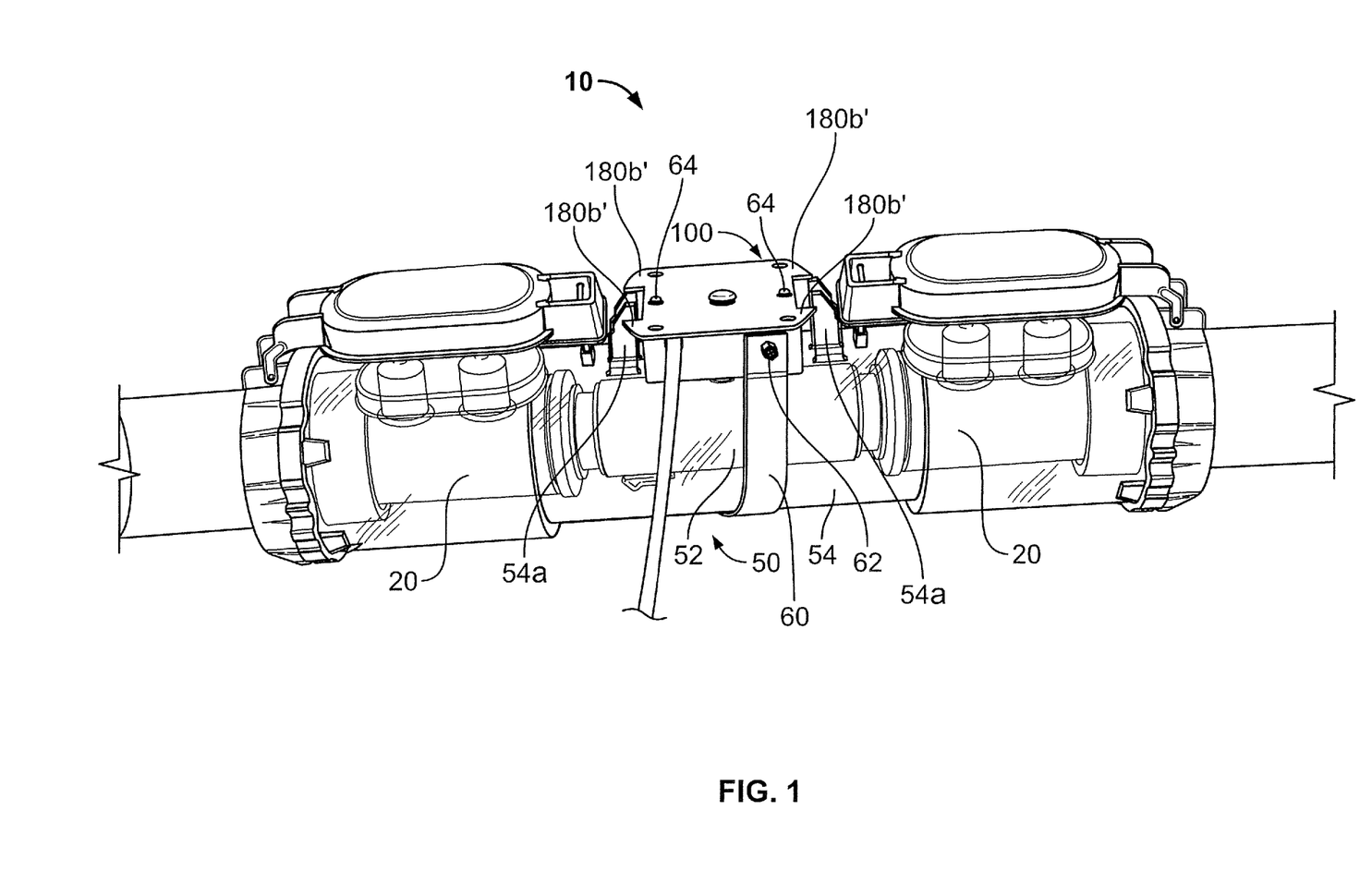
FIG. 1 is a perspective view of an overcurrent protection component assembly including an operation detection device for an overcurrent protection component according to some embodiments of the present invention.

As illustrated in the embodiments of FIG. 1, an operation detection device/overcurrent protection component assembly 10 includes an overcurrent protection component 50, a bracket 60 and an operation detection device 100. It will be understood that, in some embodiments, the device 100 may be a current sensing device and may not include an operation detection event sensor. Connector ports 20 are electrically connected within the overcurrent protection component 50 and are typically connected to an electric circuit (not shown) of a power network via cables. The overcurrent protection component 50 includes a fuse element 52 and a transparent housing 54. The operation detection device 100 is mounted to the overcurrent protection component 50 by the bracket 60. The overcurrent protection component 50, which protects the electric circuit, has a closed state and an open state.

The overcurrent protection component 50 outputs a transition event when the overcurrent protection component 50 transitions between the closed state and the open state. For example, the fuse element 52 opens or disconnects the electrical connector ports 20 to open the circuit in an over-current situation that may be caused by a circuit excessive overload, inadvertent short circuit fault and/or the like. When the overcurrent protection component 50 transitions between a closed state (in which the fuse element 52 connects the connector ports 20) and an open state (in which the fuse element 52 disconnects the connector ports 20), the overcurrent protection component 50 outputs a transition event, such as an electrical arc. The arc can produce an optical event, such as a light burst, thermal energy, radio frequency (RF) energy, infrared (IR) radiation, and/or acoustic impulses (sound waves).

Figure 2:
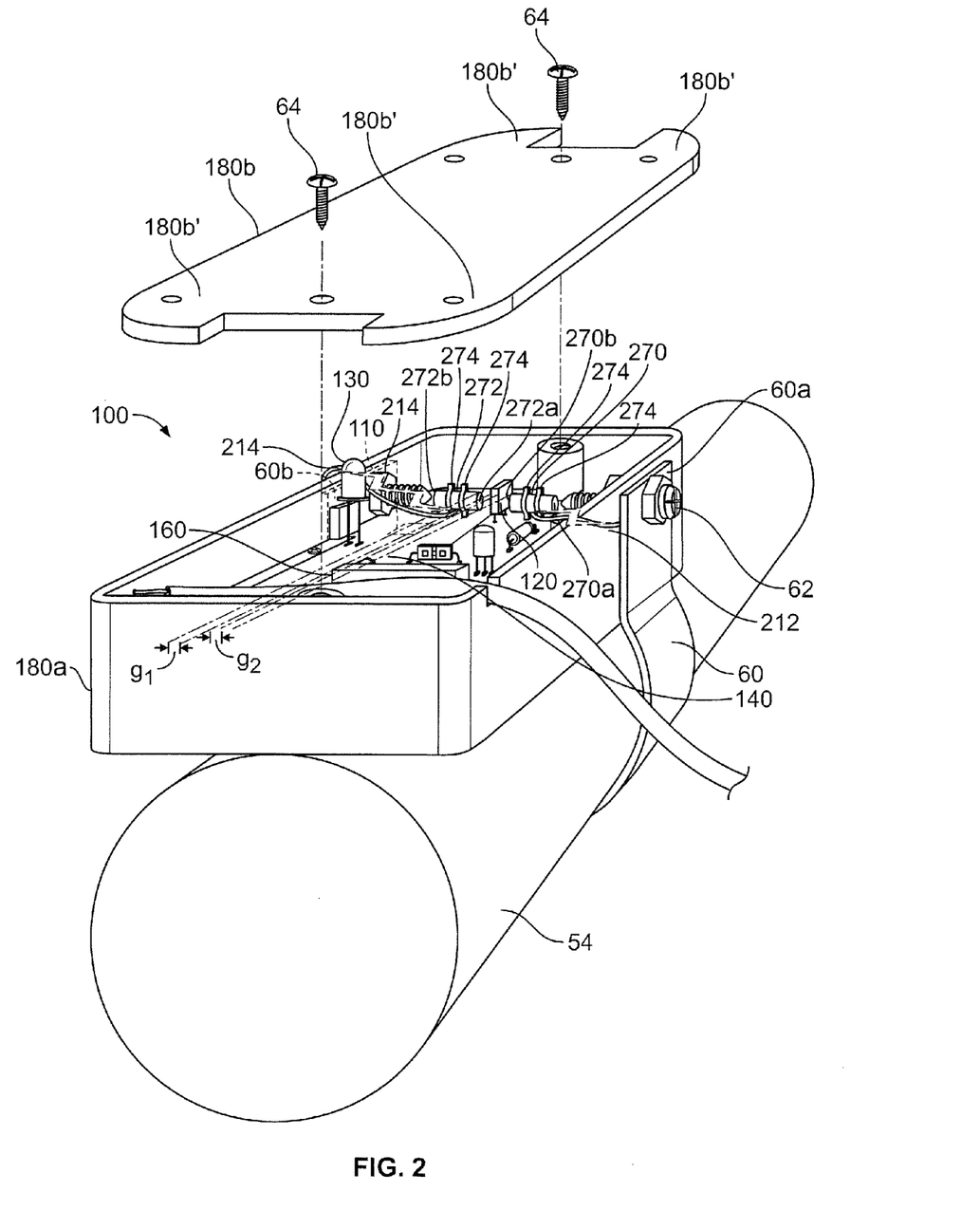
FIG. 2 is a perspective of the operation detection device of FIG. 1 according to some embodiments of the present invention.
Figure 3:
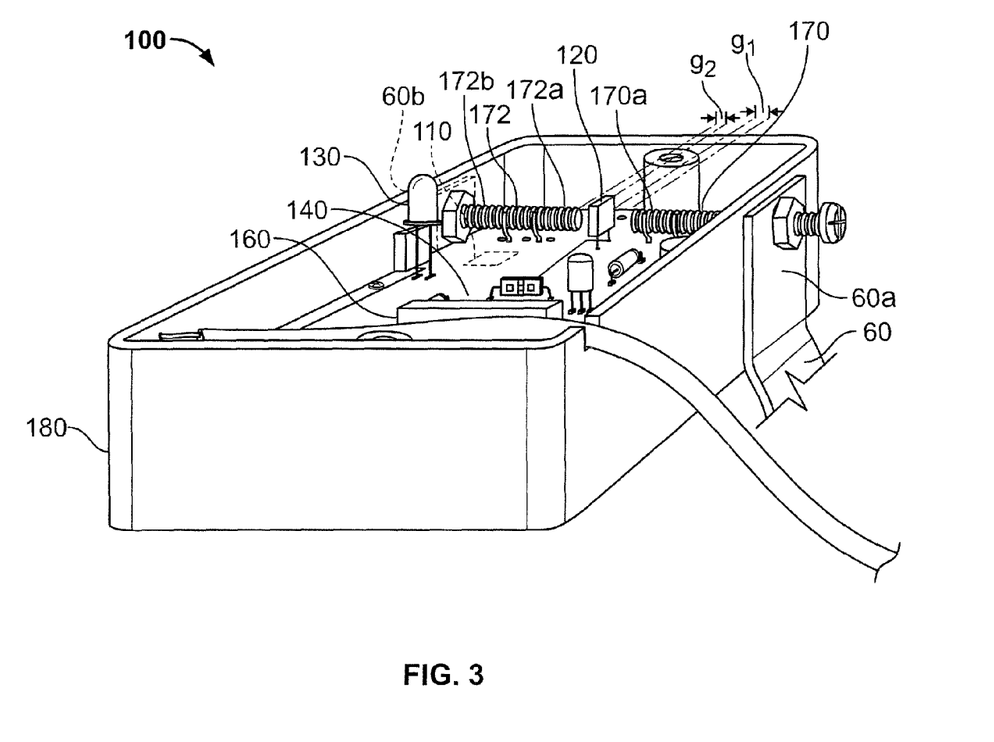
FIG. 3 is a perspective view of the operation detection device of FIG. 1 according to further embodiments of the present invention.

As illustrated in FIGS. 2 and 3, the operation detection device 100 includes an event sensor 110, a current sensor 120, a light emitting diode (LED) 130, a switch circuit 160 and a housing 180. It will be understood that other components may be included, such as a variable resistor, a reset button, an on/off button and a power supply or battery and the housing 180 may include access apertures for respective ones of these components as described in co-pending U.S. patent application Ser. No. 12/137,154. These components may be enclosed or covered to provide environmental seal of the detection device.

As shown in FIGS. 1-3, the housing 180 is configured to position the event sensor 110 adjacent the transparent housing 54 of the overcurrent protection component 50. The location of the event sensor 110 can be selected so that the event sensor 110 detects the transition event when the overcurrent protection component 50 transitions between a closed and an open state. The switch circuit 160 is operatively connected to the event sensor 110 and generates an output signal indicating a change in state of the overcurrent protection component 50 responsive to detection of the transition event by the event sensor 110.

In some embodiments, the event sensor 110 can be configured to detect one or more indicia of the electrical arc transition event, including optical indicia, heat, infrared (IR) radiation, radiofrequency (RF) radiation, acoustic energy (such as sound waves) and the like. In particular embodiments and as shown in FIGS. 1-3, the event sensor 110 is electrically isolated and/or physically displaced from the overcurrent protection component 50. Accordingly, electrical integration of the event sensor 110 with the fuse element 52 is not provided in some embodiments of the present invention.

For example, the transparent housing 54 can transmit a flash of light from an electrical arc transition event in the fuse element 52, and the event sensor 110 can be a photosensor. In some embodiments, the housing 54 may be opaque, and/or the transition event can be detected without requiring an optical sensor, e.g., by using a heat sensor, IR sensor, RF sensor and/or acoustic sensor.

Accordingly, the switch circuit 160 of the operation detection device 100 can generate an output signal indicating a change in state of the overcurrent protection component 50 responsive to detection of the transition event by the event sensor 110 when the fuse element 52 opens a circuit. For example, the event sensor 110 can be electrically isolated and/or physically displaced from the fuse element 52 before and after the fuse element 52 outputs a transition event that opens a circuit due to an over-current condition. In the configuration illustrated in FIGS. 1-3, the housing 180 of the operation detection device 100 can be removably attached to existing overcurrent protection/limiter equipment without requiring electrical integration with the fuse element 52.

As illustrated in FIG. 1, the operation detection device 100 is mounted on the light transmissive/transparent housing 54 of the overcurrent protection component 50 so as to position the event sensor 110 in a location selected to allow detection of a transition event, such as over the fusible element 52. For example, the overcurrent protection component 50 can be a Tyco Electronics Smart Limiter cable protector. In some embodiments, the sensitivity and/or false triggering of the device 100 can be controlled by physical light blockage by the housing 180. As illustrated, the device 100 can be mounted on the overcurrent protection component 50 by the bracket 60; however, the device 100 can be mounted using various techniques, including a snap fit connection, separable or integrated clamps or the like.

Figure 4:
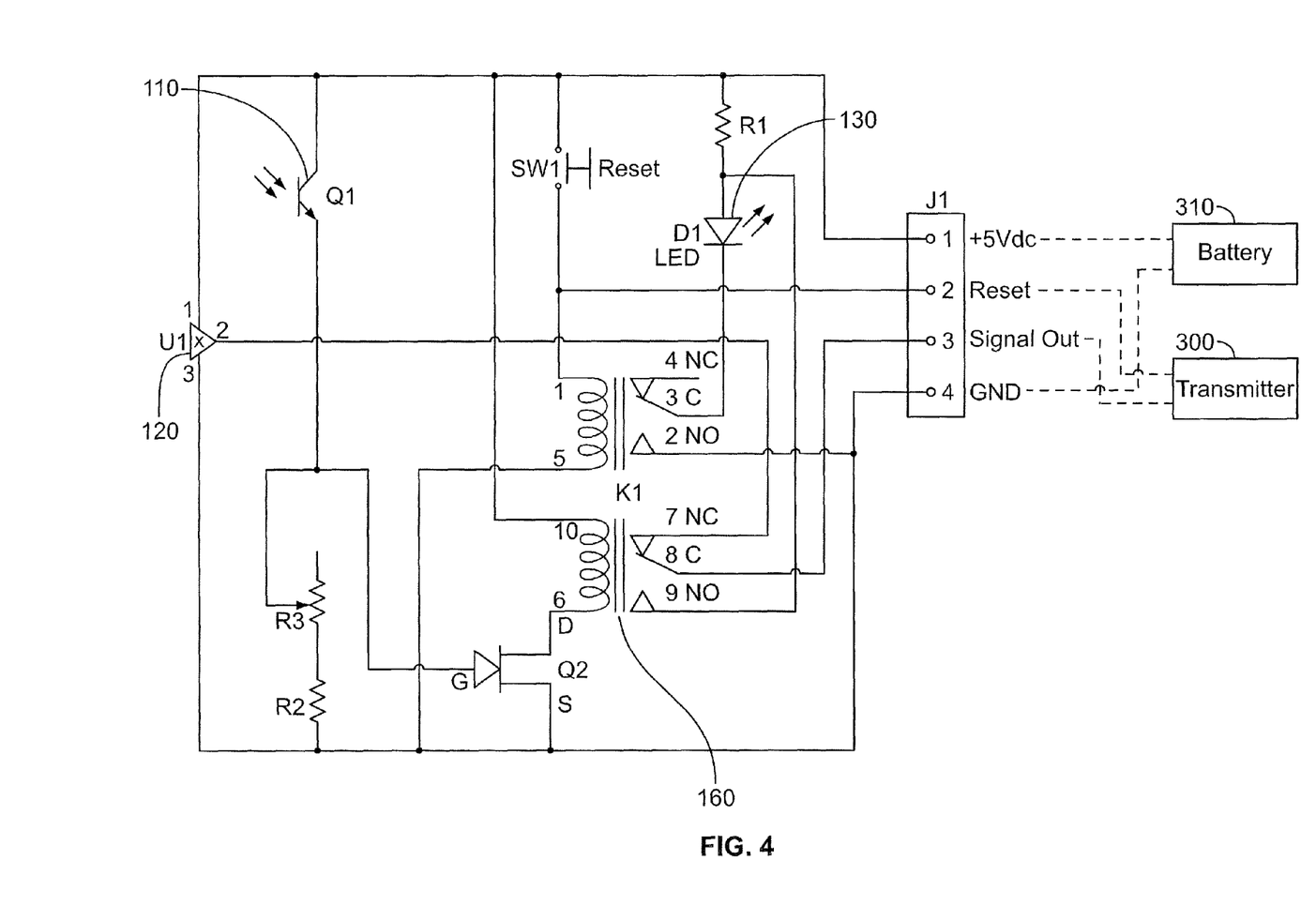
FIG. 4 is a circuit diagram of an operation detection device according to some embodiments of the present invention.

Some embodiments of the present invention, as illustrated in FIGS. 1-4, add additional functionality to the detection device by incorporation of a current monitoring circuit that may allow a user to evaluate, for example, power grid loading and load distribution. In particular, as seen in FIGS. 2-4, a current sensor 120 is positioned at a location selected to detect a current passing through the overcurrent protection component 50. The current sensor 120 generates an output signal based on a level of the detected current.

Some embodiments utilize a Hall-effect sensor, which provides a somewhat linear output signal with respect to the magnetic field strength to which it is exposed. To facilitate this current sensor function in some embodiments, the circuit may be arranged so that the Hall-effect device detects the magnetic lines of force that are generated by the current in the measured conductor. The magnetic field may be collected and concentrated by the use of a bracket/clamp that creates a magnetic circuit with an adjustable gap within which the Hall-effect device is positioned as will be described further herein. This adjustment may accommodate ranging and calibration of the output signal as well as securing the sensor device to the limitor/fuse that it is monitoring. The output of the sensor may be electrically connected to an output wire via the same latching relay used for monitoring and detecting operation of a transition event for the device in its normal state.

The output signal may be connected to a blinking LED circuit switch, such that it sends pulses to provide an active signal compared to a steady signal that may be confused with a power failure or system problem. The resulting current monitoring/event detecting device may be implemented with less expensive technologies than prior current monitoring technologies and may, thereby, be integrated practically with an overcurrent protection detection device such as described herein. Use of a non-contact triggering mechanism may provide a flexible and safe installation and may be used on several varieties of fusing/overcurrent protection mechanisms. By selection of technologies and design, some embodiments of the present invention may offer reliable sensing and monitoring at a reduced cost from traditional monitoring systems.

Referring again to FIGS. 2-3, the housing 180 includes a base 180a and a cover 180b configured to be secured to the base 180a by screws 64 or other coupling means. The event sensor 110, the current sensor 120 and the switch circuit 160 are positioned in the housing 180. The housing 180 is configured to be attached to the overcurrent protection component 50 so as to position the event sensor 110 and the current sensor 120 at their respective selected locations. As seen in the embodiments of FIG. 1, the cover 180b may include end features 180b' configured to align and mate with corresponding alignment features 54A (FIG. 1) on the transparent housing 54. The mating features 180B', 54A may limit rotational and longitudinal movement of the device 100 so as to properly position the respective sensors 110, 120 at their selected locations with sufficient accuracy to assure proper performance of their operational functions.

The embodiments of FIGS. 2 and 3 differ in the configuration of an adjustable calibration component 170, 172, 270, 272 operatively coupled to the current sensor 120 that are configured to set the sensitivity of the current sensor 120 to the level of the detected current flowing through the overcurrent protection component 50. In the embodiments of both FIG. 2 and FIG. 3, the current sensor 120 will be described with reference to a Hall-effect sensor and the adjustable calibration component is a movable magnetic field enhancing component.

In particular, for the embodiments of FIG. 2, the magnetic field enhancing component is a pair of ferrite core elements 270, 272 mounted proximate the Hall-effect sensor 120 that are movable relative to the Hall-effect sensor 120 to set a desired sensitivity of the Hall-effect sensor 120 to the level of the detected current field. The ferrite core elements 270, 272 are positioned on opposite sides of the Hall-effect sensor 120.

As illustrated in FIG. 2, the ferrite core elements 270, 272 are each positioned in respective brackets 274, which are configured to allow manual shifting of the respective ferrite core elements 270, 272 towards or away from the Hall-effect sensor 120 to set their respective air gaps $g_1$, $g_2$ relative to the Hall-effect sensor 120. Magnetic field enhancing circuit connections, such as metal traces and/or wires 212, 214, couple the respective brackets 274 to the screws 62 attaching the bracket 60 to the housing 180.

Referring now to the embodiments of FIG. 3, the magnetic field enhancing component is a pair of metal screws 170, 172 with the Hall-effect sensor 120 positioned therebetween. The metal screws 170, 172 may be rotated to set the desired air gap $g_1$, $g_2$ between an end 170a, 172a of the metal screws 170, 172 and the Hall-effect sensor 120. Second ends 170b, 172b of the metal screws 170, 172 are configured to be rotationally driven and are accessible from outside the housing 180 to facilitate setting of a desired sensitivity of the Hall-effect sensor 120 to the level of the detected current.

For both the embodiments of FIG. 2 and FIG. 3, the bracket 60 acts as a magnetic flux concentrator extending around the overcurrent protection component 50. The bracket 60 extends from a first end 60a coupled to one of the metal screws 170 to a second, opposite end 60b coupled to the other of the metal screws 172 in the embodiments of FIG. 3. For the embodiments of FIG. 2, the respective ends 60a, 60b are coupled to the ferrite core elements 270, 272 through the traces 212, 214. In the embodiments illustrated in FIG. 2 and FIG. 3 the bracket 60 serves both as the magnetic flux concentrator and to attach the housing 180 to the overcurrent protection device 100. However, it will be understood that a separate means for physically attaching the housing 180 may be provided.

Referring now to FIG. 4, the event sensor 110 may include a phototransistor Q1 and the switch circuit 160 may include a latching relay K1. It will be understood that optical sensors are not limited to the illustrated phototransistor Q1. For example, a photodiode can be used. The phototransistor Q1 is configured to detect and activate ("trigger") by generating an output signal responsive to a flash of light that is emitted from the fuse element 52 (FIG. 1) when the fuse element 52 opens a circuit (breaks the connection between the ports 20) to protect the circuit from an over-current condition.

The phototransistor Q1 can have a response time sufficient to detect sub-millisecond light bursts. The activation of the phototransistor Q1 can be used to switch a semiconductor device field effect transistor (FET) Q2, which switches the state of the latching relay K1. A relay contact signal (output signal) from the latching relay K1 can be used to control local and/or remote notification of the status of the operation control device 100. For example, the latching relay K1 can trigger illumination of the diode D1 (corresponding to the LED 130 of FIGS. 1-3) to provide a local notification signal indicating that the overcurrent protection component 50 is in the open state. In particular embodiments, the use of a blinking LED or LED circuit can reduce power consumption and/or increase the battery life of the operation detection device 100. In some embodiments, the latching relay K1 can trigger a remote notification of the status of the overcurrent protection component 50, for example, by triggering a transmitter 300 to transmit a signal to a remote device.

The latching relay K1 can remain in the "triggered" state until, for example, the latching relay K1 is reset by operation of the reset switch SW1. The reset switch SW1 can be a magnetic reed or the like to support environmental sealing of the housing 180 while providing a local reset button on the housing 180.

In particular embodiments as shown in FIG. 4, the sensitivity and/or false triggering of the device 100 can be controlled by the variable resistor R3. However, in some embodiments, a fixed value resistor can be used. In various embodiments, the selection of the circuit design and component selection for the circuit, may result in a longer battery life for a battery 310 provided in the housing 180, re-settable operation, and reduced maintenance such that the device 100 may be substantially maintenance free.

As also seen in the embodiments of FIG. 4, the output signals from the current sensor 120 and the output signal generated responsive to operation of the photodetector 110 are both routed through the switch circuit 160 including the relay K1 to provide a single composite signal (signal out) shown as output on Pin3 (of connector J1) in FIG. 4. The composite output signal has first, second and third states as will now be further described with reference to FIGS. 6A-6E.

Figure 6A:
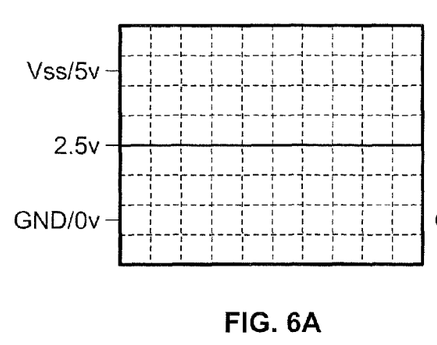
FIGS. 6A-6E are schematic illustrations of a composite output signal from the operation detection device of FIG. 1 under various operation states according to some embodiments of the present invention.
Figure 6B:
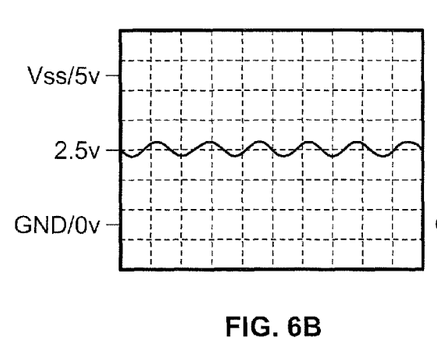
Figure 6C:
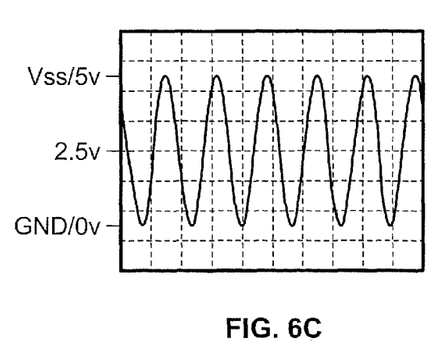

The zero detected current state illustrated in FIG. 6A provides an intermediate output, such as a 2.5 volt DC signal where a 5 volt power supply is used as shown in FIG. 6A. The illustrated output voltage level is generated in some embodiments by the use of a Hall-effect sensor 120 that outputs an immediate voltage level between the supply voltage level and ground when no current is detected. FIGS. 6B and 6C illustrate conditions when the sensors 110, 120 are operational and a current is passing through the overcurrent protection component 50. In FIG. 6B, an output sine wave signal with an associated peak positive voltage at 3.3 volts relative to ground about a 2.5 volt DC flat level is shown as being output responsive to detection of 200 amperes of AC current in the circuit under test. As the current in the circuit under test increases, the output will result in a sine wave signal with a proportionally increased peak voltage as illustrated in FIG. 6C. Note that the peak output signal voltage will be limited to the supply voltage, shown as 5 volts DC in the illustrated examples, which may be calibrated to correlate to a circuit current of 1000 amperes or other desired maximum detected current level. Thus, FIGS. 6B and 6C illustrate a state where the voltage signal has a peak voltage corresponding to a level of the detected current.

Figure 6D:
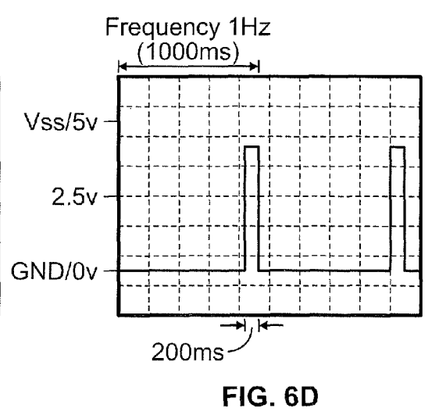
Figure 6E:
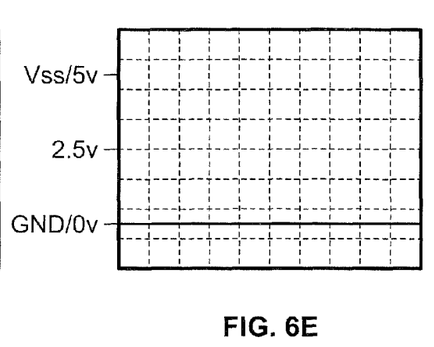

FIG. 6D illustrates the signal output when the event sensor 110 detects the transition event. The illustrated pulse results in a square wave signal with a peak positive voltage of about 3 volts DC in the illustrated embodiments and with a frequency of about 1 hertz and a duration of about 200 milliseconds in the illustrated embodiments of FIG. 6D. This active notification indicates that the detection device 100 is operational but a transition event has been detected. As noted above, the pulse conditioned output in FIG. 6D in some embodiments is provided by using a blinking LED circuit including the LED 130 and resistor R1 that sends pulses on the signal output of Pin3 to provide an active signal compared to a steady signal that may not be distinguishable from a power failure or other system problem. Finally, a further state shown as a ground signal in FIG. 6E of zero volts DC indicates a failure of the operation detection device 50. Thus, a detection device 50 may be provided having a first state indicating the transition event has been detected (see FIG. 6D), a second state indicating a level of the detected current (FIGS. 6A, 6B and 6C) and a third state indicating a failure of the operation detection device (FIG. 6E).

Figure 5:
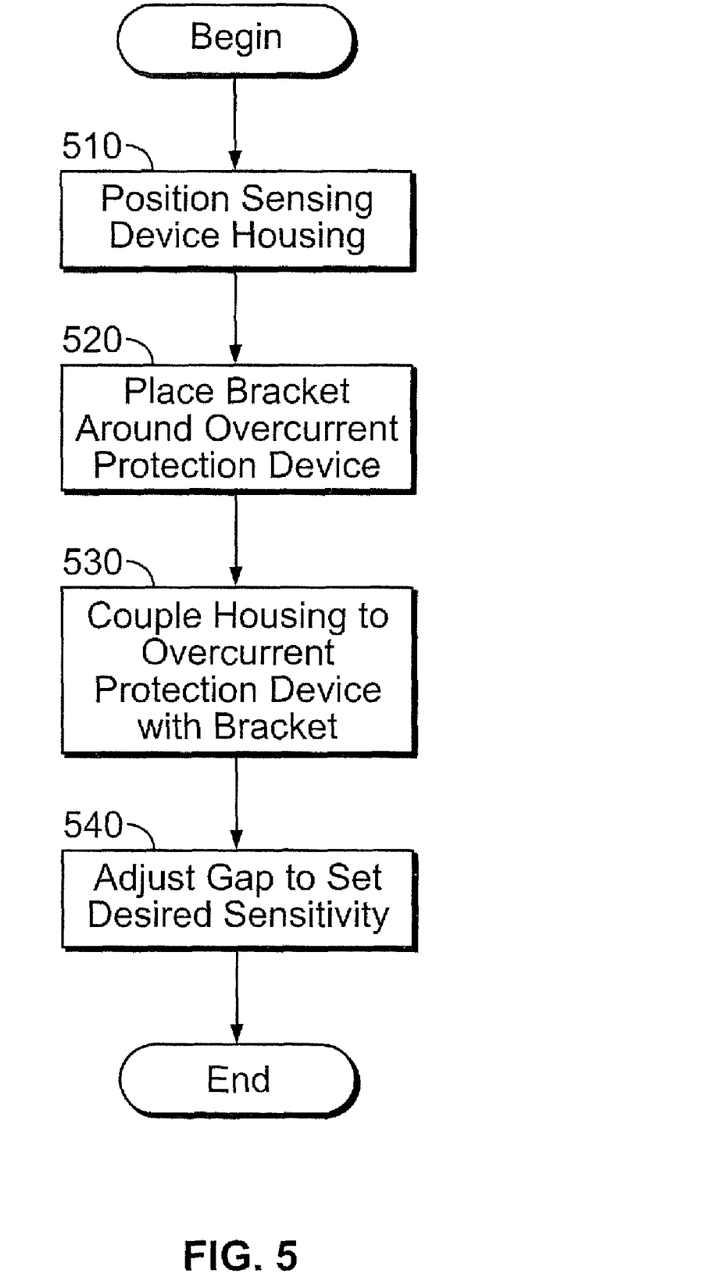
FIG. 5 is a flowchart illustrating operations for calibrating the operation detection device of FIG. 1 according to some embodiments of the present invention.

Operations according to some embodiments of methods for calibrating a current sensing device for an overcurrent protection component will now be described with reference to the flowchart illustration of FIG. 5. The overcurrent protection component has a closed state and an open state and outputs a transition event responsive to a transition between the closed state and the open state. Operations begin at Block 510 by positioning a housing containing the current sensing device at a selected location on the overcurrent protection component. A bracket that is a magnetic flux concentrating material is positioned around the overcurrent protection component with respective ends of the bracket positioned proximate opposite sides of the housing (Block 520). The housing is coupled to the overcurrent protection device using respective first and second screws extending into the housing to a position proximate a Hall-effect current sensor in the housing (Block 530). A gap between ends of the screws proximate the Hall-effect current sensor is adjusted by rotating opposite ends of the screws extending from the housing to obtain a desired sensitivity of the Hall-effect sensor to a current flowing through the overcurrent protection component (Block 540).

Although embodiments of the current invention are illustrated with respect to the operation detection device 100 and the overcurrent protection component 50, it should be understood that various modifications to the illustrated embodiments of the operation detection device 100 and the overcurrent protection component 50 may also be provided in some embodiments of the present invention. For example, although the operation detection device 100 is illustrated as a separate device that is detachably mounted to the overcurrent protection component 50, it should be understood that the operation detection device 100 can be integrated with and provided in a single housing with the overcurrent protection component 50 in some embodiments. The operation detection device 100 may include a power supply or battery; however, it should be understood that the power supply can be provided by an external source, such as from another local circuit or the overcurrent protection component 50 itself.

Although embodiments according to the present invention are described with respect to the event sensor 110 being a phototransistor Q1 in FIGS. 2-4, it should be understood that other types of optical and non-optical sensors can be used. In some embodiments, the housing 54 of the overcurrent protection component 50 is opaque, and/or the operation detection device 100 can detect a transition event without requiring photon/optical detection. For example, the detection of a transition event from the overcurrent protection component 50 can be through the detection of radiofrequency (RF) (such as broadband radiofrequency (RF)) energy produced by an arc generated by triggering of the fuse element 52. In other embodiments, light reception and/or infrared (IR) (such as band filtered infrared (IR)) radiation due to the heat of the arc may be used for detecting the transition event. Further approaches include, for example, a time weighted change (e.g., integrator based) in the current flow through the overcurrent protection component 50 to detect sudden changes terminating at zero current flow and/or acoustic impulses (e.g., sound waves), such as acoustic impulses detected from the housing 54 of the overcurrent protection component 50. It will also be understood that a combination of these varied detection approaches may be used in some embodiments of the present invention. Accordingly, RF detectors, IR detectors, and/or acoustic detectors (such as microphones) may be used to detect a transition event from the overcurrent protection component 50.

Although the event sensor 110 is illustrated as being positioned adjacent the overcurrent protection component 50, it should be understood that any suitable configuration can be used. If the event sensor 110 is an optical sensor, any configuration suitable for the event sensor 110 to detect light may be used. For example, the event sensor 110 can be positioned inside the housing 54 and light can be transmitted to the event sensor 110 via an optical fiber or other suitable light transmitter.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed is:

1. An operation detection device for an overcurrent protection component, the overcurrent protection component having a closed state and an open state and outputting a transition event responsive to a transition between the closed state and the open state, the device comprising:
    an event sensor positioned at a location selected to allow the event sensor to detect the transition event;
    a current sensor positioned at a selected location and configured to detect a level of a current passing through the overcurrent protection component when the overcurrent protection component is in the closed state and to generate a first output signal based on the detected level of the current passing through the overcurrent protection component; and
    a switch circuit operatively coupled to the event sensor that is configured to generate a second output signal indicating a change in state of the overcurrent protection component responsive to detection of the transition event by the event sensor.

2. The operation detection device of claim 1, further comprising a housing configured to attach to the overcurrent protection component, wherein the event sensor, the current sensor and the switch circuit are positioned in the housing and the housing is configured to be attached so as to position the event sensor and the current sensor at their respective selected locations.

3. An operation detection device for an overcurrent protection component, the overcurrent protection component having a closed state and an open state and outputting a transition event responsive to a transition between the closed state and the open state, the device comprising:
    an event sensor positioned at a location selected to allow the event sensor to detect the transition event;
    a current sensor positioned at a location selected to detect a current passing through the overcurrent protection component and to generate a first output signal based on a level of the detected current;
    a switch circuit operatively coupled to the event sensor that is configured to generate a second output signal indicating a change in state of the overcurrent protection component responsive to detection of the transition event by the event sensor; and
    an adjustable calibration component operatively coupled to the current sensor that is configured to set the sensitivity of the current sensor to the level of the detected current.

4. The operation detection device of claim 3, wherein the current sensor comprises a Hall-effect sensor and wherein the adjustable calibration component comprises a movable magnetic field enhancing component.

5. The operation detection device of claim 4, wherein the magnetic field enhancing component comprises a ferrite core element mounted proximate the Hall-effect sensor that is movable relative to the Hall-effect sensor to set a desired sensitivity of the Hall-effect sensor to the level of the detected current.

6. The operation detection device of claim 5, wherein the ferrite core element comprises a pair of ferrite core elements positioned on opposite sides of the Hall-effect sensor.

7. The operation detection device of claim 4, wherein the magnetic field enhancing component comprises a metal screw, accessible from outside the housing, that may be rotated to set a desired air gap between an end of the metal screw and the Hall-effect sensor to set a desired sensitivity of the Hall-effect sensor to the level of the detected current.

8. The operation detection device of claim 7, wherein the metal screw comprises a pair of metal screws with the Hall-effect sensor positioned therebetween, wherein the metal screws may be respectively rotated to change a distance between ends thereof proximate the Hall-effect sensor.

9. The operation detection device of claim 8, further comprising a housing configured to attach to the overcurrent protection component, wherein the event sensor, the Hall-effect sensor and the switch circuit are positioned in the housing and the housing is configured to be attached so as to position the event sensor and the current sensor at their respective selected locations and wherein second ends of the metal screws are configured to be rotationally driven and are accessible from outside the housing.

10. The operation detection device of claim 9, further comprising a magnetic flux concentrator extending around the overcurrent protection component that has a first end coupled to one of the metal screws and a second, opposite, end coupled to the other of the metal screws.

11. The operation detection device of claim 10, wherein the magnetic flux concentrator comprises a bracket configured to attach the housing to the overcurrent protection device.

12. The operation detection device of claim 4, wherein the first output signal and the second output signal have a first state indicating the transition event has been detected, a second state indicating the level of the detected current and a third state indicating a failure of the operation detection device.

13. The operation detection device of claim 12, wherein the Hall-effect sensor outputs an intermediate voltage level between a supply voltage level and ground when no current is detected and wherein the event sensor outputs a square wave when the transition event is detected and wherein the first state comprises the square wave as the second output signal, the second state comprises a voltage signal having a peak voltage corresponding to the level of the detected current as the first output signal and the third state comprises a ground signal as the first output signal.

14. The operation detection device of claim 13, wherein the first output signal is routed through the switch circuit and combined with the second output signal to provide a single composite signal having the first state, the second state and the third state.

15. The operation detection device of claim 14, wherein the switch circuit further comprises a transmitter configured to transmit the composite signal to provide a remote notification.

16. The operation detection device of claim 14, further comprising a light emitting device (LED) and wherein the switch circuit is configured to illuminate the LED responsive to detection of the transition event by the event sensor to provide a local notification of detection of the transition event.

17. A current sensing device for an overcurrent protection component, the overcurrent protection component having a closed state and an open state and outputting a transition event responsive to a transition between the closed state and the open state, the device comprising:
   a housing configured to attach to the overcurrent protection component;
   a Hall-effect sensor positioned in the housing to detect a current passing through the overcurrent protection component and to generate an output signal based on a level of the detected current, wherein the housing is configured to be attached so as to position the Hall-effect sensor at a selected location to detect the current; and
   an adjustable magnetic field enhancing component, wherein the adjustable magnetic field enhancing component comprises a pair of metal screws with the Hall-effect sensor positioned therebetween, wherein the metal screws may be respectively rotated to change a distance between first ends thereof proximate the Hall-effect sensor and wherein second ends of the metal screws configured to be rotationally driven are accessible from outside the housing.

18. The current sensing device of claim 17, further comprising a magnetic flux concentrator extending around the overcurrent protection component that has a first end coupled to one of the metal screws and a second, opposite, end coupled to the other of the metal screws.

19. The current sensing device of claim 18, wherein the magnetic flux concentrator comprises a bracket configured to attach the housing to the overcurrent protection device.

20. A method for calibrating a current sensing device for an overcurrent protection component, the overcurrent protection component having a closed state and an open state and outputting a transition event responsive to a transition between the closed state and the open state, the method comprising:
   positioning a housing containing the current sensing device at a selected location on the overcurrent protection component;
   placing a bracket that is a magnetic flux concentrating material around the overcurrent protection component with respective ends of the bracket positioned proximate opposite sides of the housing;
   coupling the housing to the overcurrent protection device using respective first and second screws extending into the housing to a position proximate a Hall-effect current sensor in the housing; and
   adjusting a gap between ends of the screws proximate the Hall-effect current sensor by rotating opposite ends of the screws extending from the housing to obtain a desired sensitivity of the Hall-effect sensor to a current flowing through the overcurrent protection component.

\* \* \* \* \*